United States Patent
Yang et al.

(10) Patent No.: US 7,449,792 B2
(45) Date of Patent: Nov. 11, 2008

(54) PATTERN REGISTRATION MARK DESIGNS FOR USE IN PHOTOLITHOGRAPHY AND METHODS OF USING THE SAME

(75) Inventors: Chin Cheng Yang, Hsinchu (TW); Chih Hao Huang, Taoyuan County (TW)

(73) Assignee: MACRONIX International Co., Ltd., Hsinchu (TW)

( * ) Notice: Subject to any disclaimer, the term of this patent is extended or adjusted under 35 U.S.C. 154(b) by 72 days.

(21) Appl. No.: 11/410,424

(22) Filed: Apr. 25, 2006

(65) Prior Publication Data
US 2007/0246843 A1    Oct. 25, 2007

(51) Int. Cl.
*H01L 23/544* (2006.01)
*H01L 21/76* (2006.01)

(52) U.S. Cl. ............... 257/797; 257/E23.179; 438/401

(58) Field of Classification Search ............ 430/401; 257/797, E23.179
See application file for complete search history.

(56) References Cited

U.S. PATENT DOCUMENTS

| | | | |
|---|---|---|---|
| 4,980,718 A | 12/1990 | Salter et al. | |
| 5,919,714 A | 7/1999 | Chen et al. | |
| 6,083,807 A * | 7/2000 | Hsu | 438/401 |
| 6,093,640 A | 7/2000 | Hsu et al. | |
| 6,118,185 A | 9/2000 | Chen et al. | |
| 6,172,409 B1 * | 1/2001 | Zhou | 257/620 |
| 6,303,460 B1 * | 10/2001 | Iwamatsu | 438/401 |
| 6,596,603 B1 * | 7/2003 | Narimatsu | 438/401 |
| 6,697,698 B2 | 2/2004 | Yoshitake et al. | |
| 6,801,313 B1 * | 10/2004 | Yokota | 356/401 |
| 6,809,420 B1 * | 10/2004 | Wong | 257/773 |
| 7,033,904 B2 * | 4/2006 | Kirikoshi et al. | 438/401 |
| 7,190,824 B2 * | 3/2007 | Chen | 382/151 |
| 7,192,845 B2 * | 3/2007 | Yen et al. | 438/462 |
| 7,196,429 B2 * | 3/2007 | Yen et al. | 257/797 |
| 2001/0048145 A1 * | 12/2001 | Takeuchi et al. | 257/620 |
| 2005/0051909 A1 * | 3/2005 | Inomata | 257/797 |

* cited by examiner

*Primary Examiner*—W. David Coleman
(74) *Attorney, Agent, or Firm*—Jianq Chyun IP Office

(57) ABSTRACT

Pattern registration marks which include: a substrate and an upper material layer disposed above the substrate; an outer trench formed in the upper material layer, the outer trench having an outer trench width; an inner trench formed in the upper material layer, the inner trench having an inner trench width; and a conformal layer disposed in the inner trench and the outer trench, the conformal layer having a conformal layer thickness; wherein the outer trench width is greater than twice the conformal layer thickness, and wherein the inner trench width is less than or equal to twice the conformal layer thickness; and methods of using the same.

22 Claims, 9 Drawing Sheets

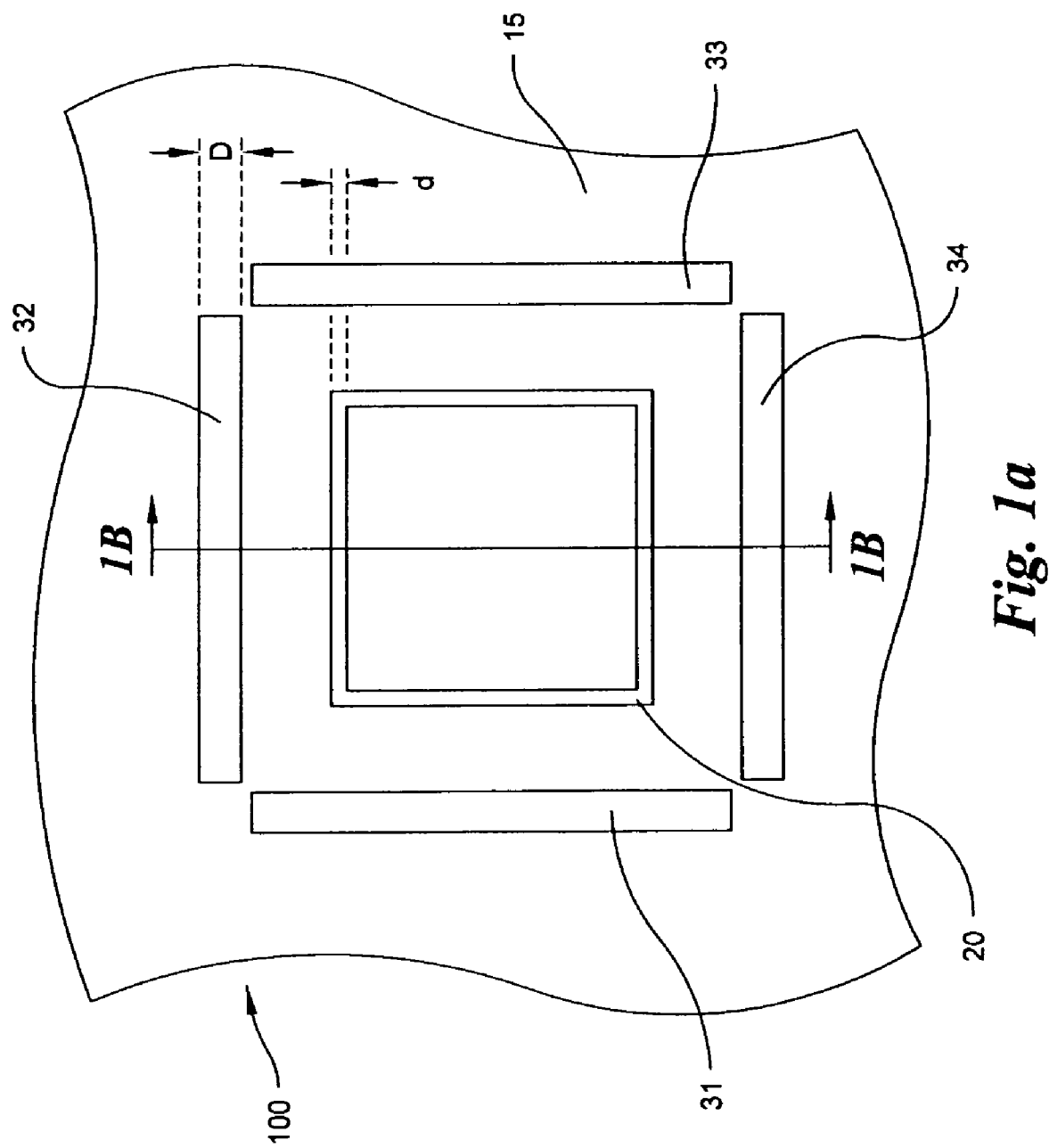

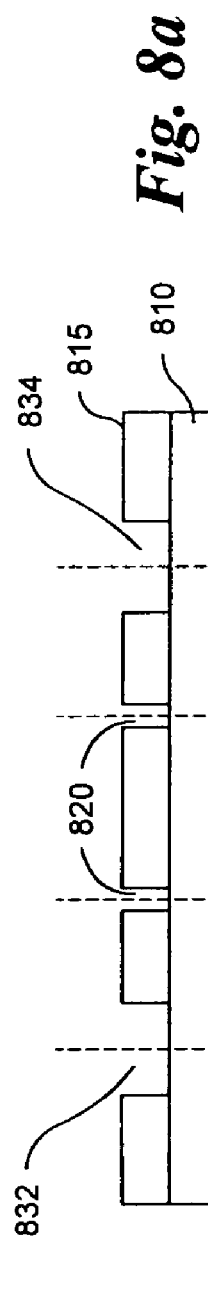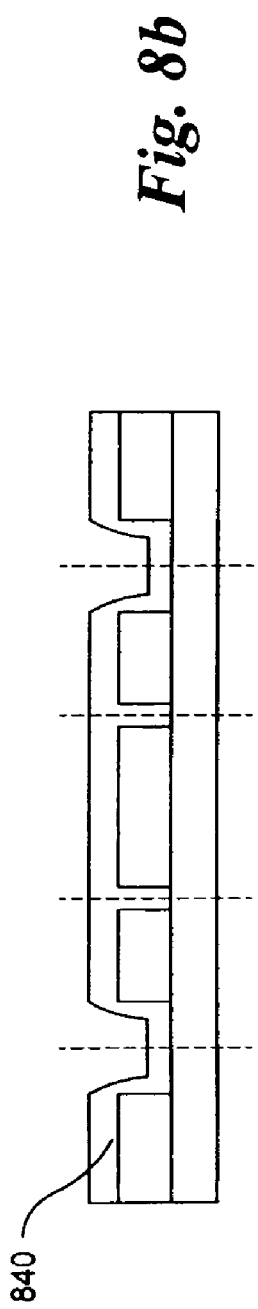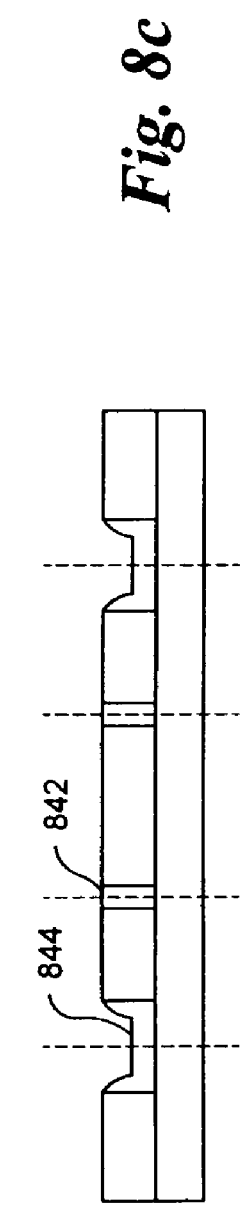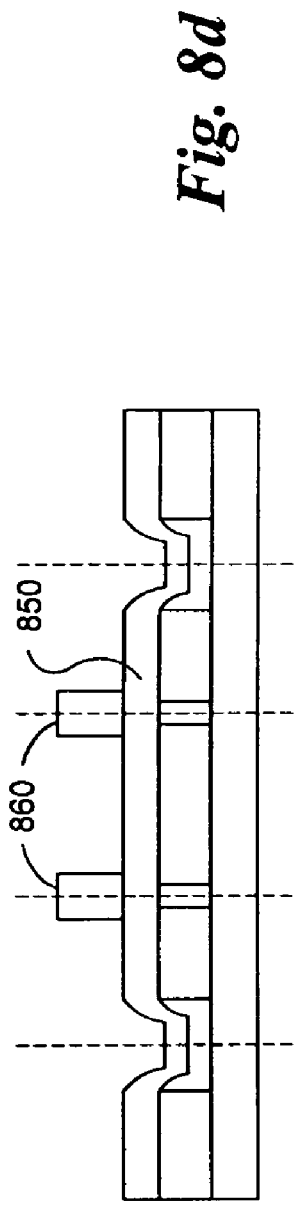

PATTERN REGISTRATION MARK DESIGNS FOR USE IN PHOTOLITHOGRAPHY AND METHODS OF USING THE SAME

BACKGROUND OF THE INVENTION

Various stages of semiconductor device manufacturing can often include the deposition of multiple layers of a variety of materials. Such multi-layer manufacturing often includes, repeating for each layer of the device, a step of depositing a conductive or insulating layer on a wafer and a lithography step of coating a resist material as a photosensitive agent on the layer, subjecting the resist material to light exposure with a circuit pattern on a reticle disposed therebetween, developing the pattern and etching the layer with use of the remaining resist material as a mask to form the circuit pattern on the wafer in the layer.

Pattern registration, or pattern alignment, is a key part of successful photolithography. During the manufacture of semiconductor devices and integrated circuits, many masks can be used in succession and in almost all cases, any given mask will need to be aligned relative to its predecessors with a degree of precision that is at least as well controlled as other pattern-related features such as line width so that successive patterns are aligned.

When the circuit pattern of a successive layer is positionally shifted (i.e., does not line up properly) relative to a pattern in an underlying layer, the circuit can become disconnected or short-circuited, which results in the production of a faulty or defective device. Accordingly, to avoid misalignment of successive layers by shifting of their respective patterns during lithography, the lithography exposure apparatus is often designed and equipped to detect alignment marks (i.e., pattern registration marks) provided in the device in an underlying layer, and subsequently position the successive layer pattern on the basis of the location of the alignment marks in the underlying layer.

One existing method of providing layer-upon-layer pattern alignment in multilayer semiconductor devices is through the use of a pattern registration mark format known as "box-in-box." The box-in-box pattern registration mark design and method consists of etching an outer trench having a box (e.g., square or rectangular) shape into a first layer of a semiconductor device and partially filling the box trench with a conformal material such that the bottom and the side walls of the box trench are covered, depositing a second layer of material on the first layer wherein the outer box is detectable in the upper material layer of the second layer due to the topography of the partially filled outer box in the first layer, and the placement of a subsequent pattern (i.e., a smaller box-shaped mask) for etching the second layer by aligning the smaller box-shaped material, which serves as a mask, on the upper layer relative to the outer box formed in the lower layer.

Unfortunately, such known box-in-box registration methods can be inaccurate as the center of the outer box trench can often be very difficult to correctly measure in practice due to unintended re-positioning of the material partially filling the outer box and/or the added fill of residue from planarization processes. More particularly, during the use of such box-in-box registration processes, after the outer box is formed in the first layer, it is covered along with the upper material layer of the first layer with a conformal material layer. Subsequent to the deposition of this conformal material layer over the first layer and in the outer box, all of the conformal material on the upper material layer of the first layer, other than that which is located in the outer box, is removed prior to deposition of the second layer. Two of the commonly employed methods for removing the conformal material outside of the outer box include dry etching and chemical-mechanical polishing (CMP). Unfortunately, neither method is entirely suitable for accurate pattern registration.

Dry etching can selectively remove the material outside of the outer box, but can also cause damage to the etched surfaces and more importantly can damage the interface between the first layer and second layer. Chemical-mechanical polishing, while not causing interface damage like dry etching, suffers from the difficulty associated with the shift and/or rotation of the position of the material located in the outer trench. As the CMP process is carried out, the material deposited in the outer box can become lopsided due to residue from the CMP process such that one side wall of the trench is more heavily coated than another side. As a result, the center of the trench identified by the material partially filling the outer box trench is detected at a location that does not correspond with the center of the outer box trench. When a subsequent pattern is then aligned based on the outer box, that subsequent pattern is also shifted in an amount roughly equivalent to the error associated with the shift of the outer box.

Accordingly, a need exists for new pattern registration mark designs and methods of aligning patterns in the art of semiconductor manufacturing and photolithography.

BRIEF SUMMARY OF THE INVENTION

The present invention relates to pattern registration marks and methods of using the same, and more particularly, to pattern registration marks for use in lithographic processes, especially in the photolithography of semiconductor device manufacturing. Pattern registration marks in accordance with the present invention can allow accurate and precise alignment of successive patterns, regardless of shift or registration error in the bottom mark which can result from chemical-mechanical polishing.

The pattern registration marks in accordance with the present invention and methods using the same are superior to known marks and methods in that significantly improved overlay alignment can be achieved without necessitating the use of damaging dry etch techniques. The significantly improved pattern registration marks of the present invention include an inner box or other suitable shape which is etched into a layer above a substrate along with an outer box in the same layer. The inner box trench is sized so that it is completely filled by a subsequently formed conformal layer, and thus, not subject to undesired center-shifting during removal of other portions of the conformal layer (e.g., via planarization).

One embodiment of the present invention is directed to pattern registration marks which comprise: a substrate and an upper material layer disposed above the substrate; an outer trench formed in the upper material layer, the outer trench having an outer trench width; an inner trench formed in the upper material layer, the inner trench having an inner trench width; and a conformal layer disposed in the inner trench and the outer trench, the conformal layer having a conformal layer thickness; wherein the outer trench width is greater than twice the conformal layer thickness, and wherein the inner trench width is less than or equal to twice the conformal layer thickness. In some preferred embodiments, the outer trench width is greater than twice the combined thickness of the conformal layer and a subsequently deposited layer, which can preferably comprise a metal.

Another embodiment of the present invention is directed to methods which comprise: (a) forming a pattern registration mark in an upper material layer disposed above a substrate, wherein the mark comprises an outer trench formed in the upper material layer, the outer trench having an outer trench width; an inner trench formed in the upper material layer, the inner trench having an inner trench width; and a conformal layer disposed on the upper material layer and in the inner trench and the outer trench, the conformal layer having a conformal layer thickness; wherein the outer trench width is greater than twice the conformal layer thickness, and wherein the inner trench width is less than or equal to twice the conformal layer thickness; (b) removing a portion of the conformal layer such that the remaining conformal layer is disposed in the inner trench and in the outer trench; (c) measuring a registration error between the outer trench and the inner trench of the pattern registration mark; and (d) adjusting subsequent pattern placement relative to the outer trench based on the measured registration error.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings:

FIG. 1a is a top view schematical representation of a pattern registration mark in accordance with one embodiment of the present invention;

FIGS. 8a-8d are cross-sectional schematic representations of a method using a pattern registration mark in accordance with embodiment of the present invention at various stages during the process.

DETAILED DESCRIPTION OF THE INVENTION

Figure 1B:
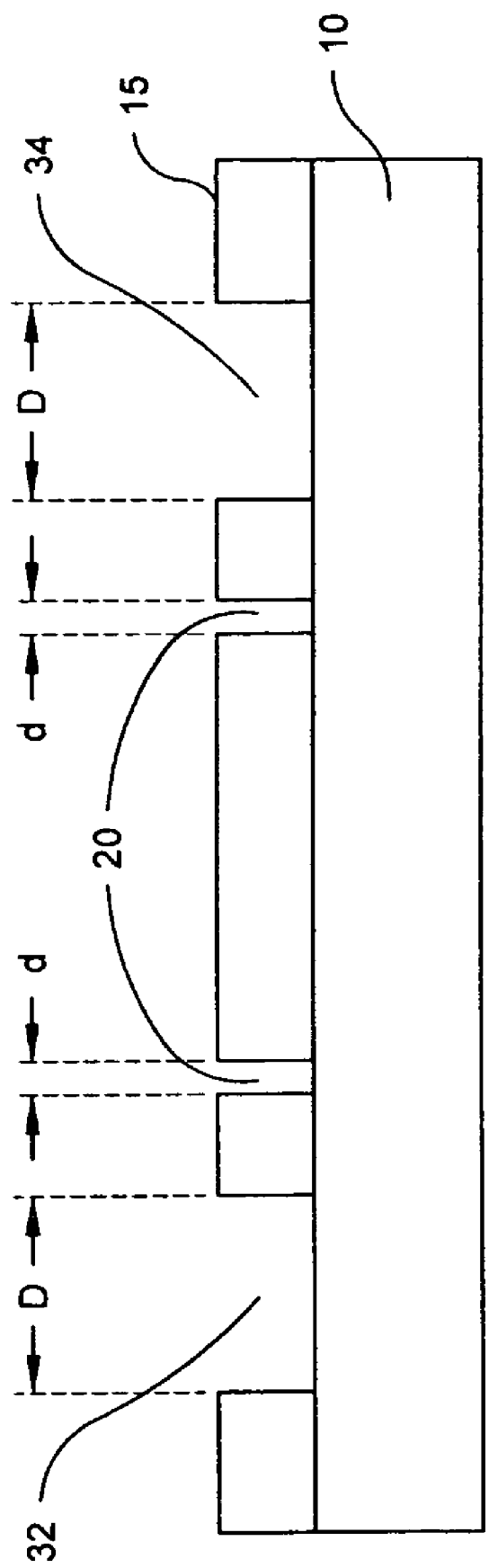
FIG. 1b is a cross-sectional schematic representation of the pattern registration mark shown in FIG. 1a taken along the line 1B-1B.

Reference will now be made in detail to the invention and the presently preferred embodiments thereof, examples of which are illustrated in the accompanying drawings. Wherever possible, the same or similar reference numbers are used in the drawings and the description to refer to the same or like parts. It should be noted that the drawings are in greatly simplified form and are not to precise scale. In reference to the disclosure herein, for purposes of convenience and clarity only, directional terms, such as top, bottom, left, right, up, down, above, below, beneath, rear, and front, are used with respect to the accompanying drawings. Such directional terms used in conjunction with the following description of the drawings should not be construed to limit the scope of the invention in any manner not explicitly set forth in the appended claims. Although the disclosure herein refers to certain illustrated embodiments, it is to be understood that these embodiments are presented by way of example and not by way of limitation. It is to be understood and appreciated that the process steps and structures described herein do not cover a complete process flow for the manufacture of entire semiconductor devices or integrated circuits. The present invention may be practiced in conjunction with various semiconductor and integrated circuit fabrication techniques that are conventionally used in the art.

The present invention includes pattern registration marks for use in lithographic processes, and in particular, lithographic processes used during the formation of semiconductor devices. In general, a pattern registration mark refers to a formation in or on a layer of a device, which formation is capable of location via an optical device for the purposes of the appropriate placement of a subsequent pattern. The pattern registration marks in accordance with the present invention comprise an inner trench and an outer trench, wherein the inner trench is sized such that it is completely filled by a conformal layer deposited on the surface in which the inner and outer trenches are formed, such that the completely filled inner trench provides a stationary reference point for the measurement of a shift in the conformal material deposited in the outer trench. Thus, center-shifting of the material in the outer trench which can result from planarization of the conformal material layer can be compensated for, via a measurement against the completely filled inner trench which, due to its completely filled structure, is not susceptible to shift via chemical mechanical polishing processes.

Pattern registration marks in accordance with the present invention can be employed in positioning patterns on any substrate to be subjected to lithographic processes. Suitable substrates include, but are not limited to, semiconductor wafers and devices such as, for example, memory arrays, peripheral programming logic circuits, switching transitors and other semiconductor junction devices formed on silicon wafers and other semiconductor materials.

Pattern registration marks in accordance with the present invention are generally formed in an upper material layer disposed above a substrate. The "upper material layer" refers to the upper-most exposed surface area of the device on which a pattern is to be formed, and in particular, the region of the exposed surface in which the pattern is to be formed, such as via an etching process. For example, the upper material layer in which a pattern registration mark according to the invention can be formed can include an insulating dielectric film which may cover, e.g., an array of memory cells disposed on a silicon wafer. In general, the upper material layer can be comprised of any material capable of being patterned or etched. Suitable materials include, but are not limited to, gate dielectric materials, (such as, e.g., oxides including silicon oxide, aluminum oxide, hafnium oxide, etc.), masking materials, (such as, e.g., nitrides including silicon nitride and oxynitride, etc.), interlayer and intermetal dielectrics (such as, e.g., boron phosphosilicate glass and similar materials). In general, the upper material layer of a substrate in which a pattern registration mark according to the present invention can be formed can include any material employed as a layer or partial layer in the manufacture of semiconductor devices, where an inner and an outer trench can be formed in the material via a patterning or etching process or other method known or to be developed for selectively removing such material to form trenches.

The inner trench and outer trench of pattern registration marks in accordance with the present invention can be formed via any suitable process for selectively removing an upper material layer material. For example, an inner trench and an outer trench can be formed via standard patterning and etching processes. As set forth above in the Summary of the Invention and as explained below in greater detail, the width of the inner trench and the width of the outer trench must satisfy certain criteria in relation to the thickness of the conformal layer disposed on the upper material layer. However, the widths of the inner trench, the outer trench and the thickness of the conformal layer can vary widely in accordance with the minimum feature size of the device being manufactured and can also vary according to the limitations of the patterning and etching methods employed. For example, a conformal tungsten layer for use in the 130 nm node devices can have a conformal layer thickness ($THK_{CL}$) of approximately 350 nm. Accordingly, the width of the inner trench can be less than or equal to 700 nm ($2*THK_{CL}$). However, the width of the inner trench should also be greater than the photoresist layer resolution. Thus, for example, given a photoresist layer resolution of 160 nm, the width of the inner trench should be greater than 160 nm. Allowing for fabrication tolerances in such an example, the range of inner trench width could preferably be about 200 to 600 nm. The width of the outer trench can vary much more widely. With reference to the example described in this paragraph, the width of an outer trench could be about 2 to 4 µm. The surface area of the upper material layer bounded by a pattern registration mark will also vary in accordance with several factors including, for example, the size of the area to be patterned.

The conformal layer can comprise any material which is capable of being deposited on an upper material layer in a manner conforming to the topography of the upper material layer. Any suitable method of deposition can be employed, including, for example, chemical vapor deposition techniques. The conformal layer can be deposited in any thickness suitable for the minimum feature size of the device, so long as the required dimensional relationships between the thickness of the conformal layer and the widths of the inner trench and the outer trench are satisfied. The conformal layer preferably comprises a metal, and more preferably, comprises tungsten.

In the pattern registration marks according to the present invention, a dimensional relationship exists between the thickness of the conformal layer and the width of the outer trench, and between the thickness of the conformal layer and the width of the inner trench.

In one aspect of the dimensional relationship, the width of the inner trench is less than or equal to the thickness of the conformal layer. The width of the inner trench is thus sized to allow complete filling of the inner trench when a conformal coating is formed on the surface of the inner trench. In other words, for example, where the conformal layer has a thickness, $THK_{CL}$, the width of the inner trench, d, satisfies the equation:

$$d \leq 2(THK_{CL}).$$

The maximum width of the inner trench can be equal to twice the thickness of the conformal layer as the inner trench is still filled with conformal material when the coating on either side of the trench meets to provide a completed fill.

In another aspect of the dimensional relationship, the width of the outer trench is greater than the thickness of the conformal layer. The width of the outer trench is thus sized such that complete filling is not attained when a conformal coating is formed on the surface of the outer trench. In other words, for example, where the conformal layer has a thickness, $THK_{CL}$, the width of the outer trench, D, satisfies the equation:

$$D > 2(THK_{CL}).$$

Where the minimum width of the outer trench is greater than twice the thickness of the conformal layer, the outer trench is not completely filled with conformal material as the conformal coating on the sides of the outer trench do not join in a middle region of the trench. In general, the outer trench of pattern registration marks according to the present invention must have a width greater than twice the thickness of the conformal layer. Thus, in general, when the upper material layer is covered with a subsequent layer to be patterned, the partially filled outer trench provides a detectable recess or mark in the topography of the subsequent layer to be patterned.

In certain preferred embodiments of the pattern registration marks according to the present invention, the width of the outer trench is greater than twice the additive thickness of both the conformal material layer and a subsequent layer to be applied and patterned above the layer in which the pattern registration mark is formed. In such embodiments, the width of the outer trench is thus sized such that complete filling is not attained even when both a conformal material layer and subsequent layer, e.g., a metal layer, are formed on the surface of the outer trench. In other words, for example, where the conformal layer has a thickness, $THK_{CL}$, and a subsequent (e.g., metal) layer has a thickness, $THK_{ML}$, the width of the outer trench, D, satisfies the equation:

$$D > 2(THK_{CL} + THK_{ML}).$$

Where the minimum width of the outer trench is greater than twice the additive thickness of the conformal layer and subsequent layer, the outer trench is not completely filled even with both the conformal material and subsequent layer formed, as the subsequent layer material on the sides of the outer trench do not join in a middle region of the trench. The topographical recess resulting in the upper material layer of the subsequent layer is more easily detectable when the width of the outer trench is sized in this manner.

Embodiments of the present invention where the width of the outer trench, D, satisfies the equation:

$$2(THK_{CL} + THK_{ML}) > D > 2(THK_{CL})$$

can include, for example: pattern registration processes wherein a photoresist patterning process is carried out before a subsequent layer is formed above the registration mark; and pattern registration processes wherein the topographical recess (step height) in the conformal layer is detectable by an overlay measurement tool, through a subsequent layer disposed above the conformal layer, i.e., processes employing an optical measurement tool which provides a measuring signal that is transmitted through the subsequent layer.

Pattern registration marks according to the present invention can include an inner trench and an outer trench which each have any suitable polylateral shape as viewed from above. In certain embodiments, the trenches of the pattern registration mark will form quadrilateral shapes. As used herein, the term "quadrilateral" refers to any four-sided shape, such as squares, rectangles, rhombuses, and parallelograms. As used herein, any reference to a quadrilateral formation, or any other shape for that matter, does not necessitate a continuous, closed shape. For example, reference to a "square" can refer to either a continuous trench in the shape of a square having four sides of equal length and four internal right angles, or a discontinuous set of two or more, and preferably four, linear trenches, which in the case of four, each can be approximately equal in length and arranged in relation to one another such that the four linear trenches form a shape similar to that of a square but missing each of its corners. A discontinuous quadrilateral may also comprise as few as two segments. For example, two L-shaped trenches can be arranged in a quadrilateral formation without forming one continuous trench.

In a similar fashion, for example, a rectangle can refer to either a continuous trench having four sides, each set of opposing sides having an equal length, and four right angles, or a discontinuous set of four linear trenches arranged in relation to one another such that the four linear trenches form a shape similar to a rectangle but missing each of its corners. As used herein, the term "equal," in reference to length measurements, refers to substantially equal dimensions wherein two or more dimensions are within +/−20% of one another, preferably within +/−10%, and more preferably within +/−5%. The inner trench and the outer trench are preferably concentric and equidistant from each other at all corresponding points along the trenches. Corresponding sides of the outer trench and the inner trench are preferably parallel to one another.

For example, referring to FIG. 1a, a pattern registration mark 100 is formed in the upper material layer 15 disposed above a substrate. FIG. 1 is a schematic top-view of a pattern registration mark in accordance with one embodiment of the present invention. Accordingly, the view is looking down on a representation of the mark formed in the upper material layer 15. The registration mark 100 includes an outer trench which is comprised of four discontinuous linear segments arranged in a quadrilateral formation 31, 32, 33, 34. The mark also includes an inner trench 20 which comprises a continuous quadrilateral formation. Each segment of the outer trench 31, 32, 33 and 34 has a width, D. In various embodiments of the present invention wherein one or both of the inner and outer trenches is comprised of two or more discontinuous segments, each segment of the trenches may have a different width so long as the widths satisfy the dimensional relationship of the present invention. The inner trench 20 has a width, d. Referring to FIG. 1b, inner trench 20 and two segments of the outer trench 32 and 34 are shown, in cross-section, as being formed in the upper material layer 15 above the substrate 10.

As used herein, the term "linear" refers to trench formations which are substantially linear, but does not require an absolutely straight line. Any portion of a trench which constitutes a side of a polylateral formation, whether part of a continuous formation or a discontinuous segment thereof, can have some irregularity which can result, for example, from photoresist patterning and etching procedures, but is preferably as straight as possible.

Figure 2:
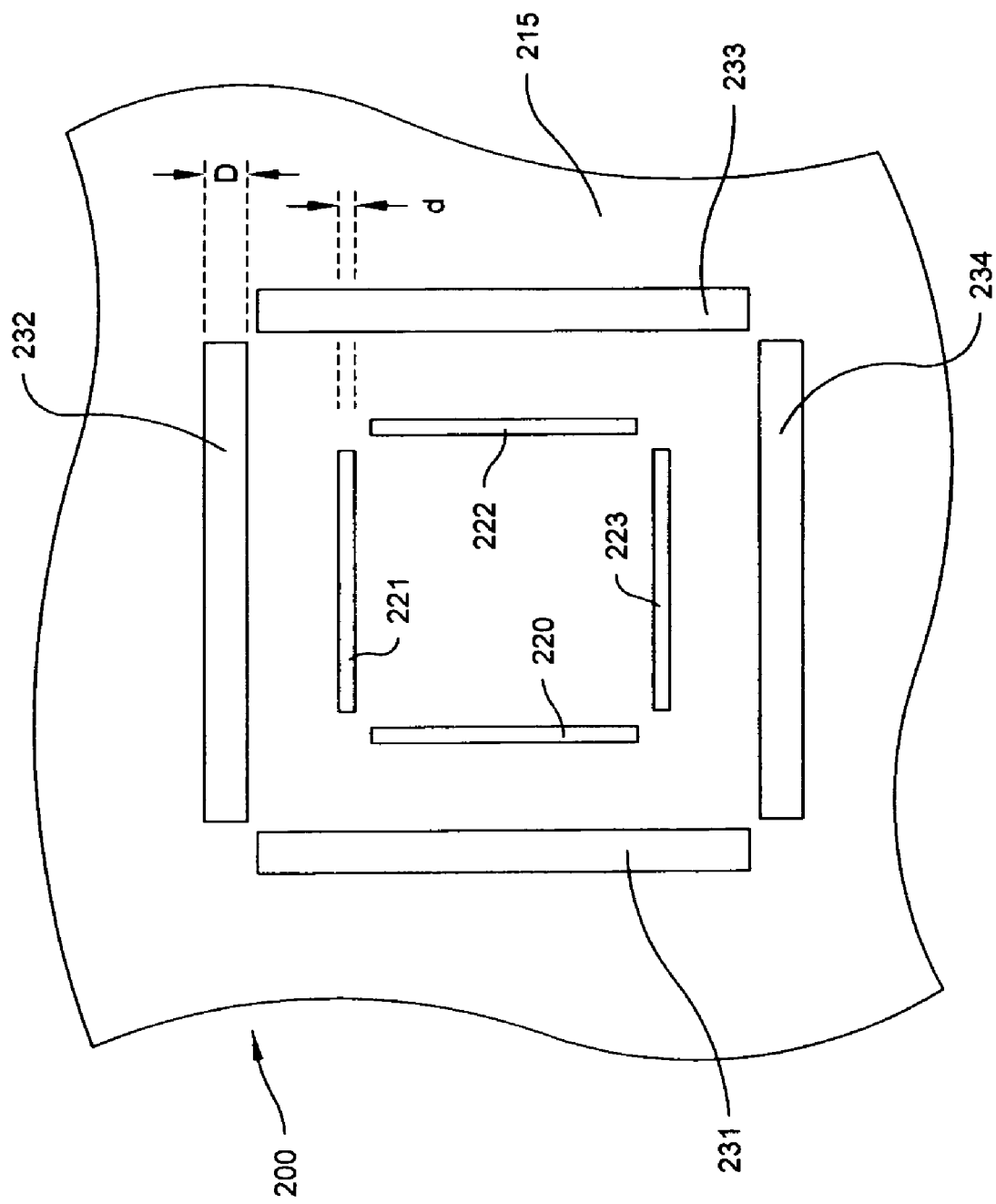
FIG. 2 is a top view schematical representation of a pattern registration mark in accordance with another embodiment of the present invention.

As used herein, the term "discontinuous" refers to segmentation of a trench. In other words, a trench may comprise multiple "discontinuous" segments where one portion of a trench formed in an upper material layer above a substrate is separated from another portion of the trench by a portion of the upper material layer which has not been removed (e.g., etched). A discontinuous trench of any suitable shape can be comprised of two or more segments. Preferably, a discontinuous trench comprises a number of segments equal to the number of sides in the shape of the trench. Thus, for example, a discontinuous quadrilateral trench preferably comprises four segments. For example, referring to FIG. 2, pattern registration mark 200 formed in an upper material layer 215 above a substrate comprises a discontinuous quadrilateral outer trench comprised of four linear segments 231, 232, 233 and 234. Additionally, pattern registration mark 200 includes a discontinuous inner trench comprised of four linear segments 220, 221, 222 and 223. A "continuous" trench refers to a trench which continues uninterrupted by unetched portions of the upper material layer such that the trench completes the shape of a polylateral, as viewed from above. For example, referring again to FIG. 1a, inner trench 20 is a continuous trench.

Figure 3:
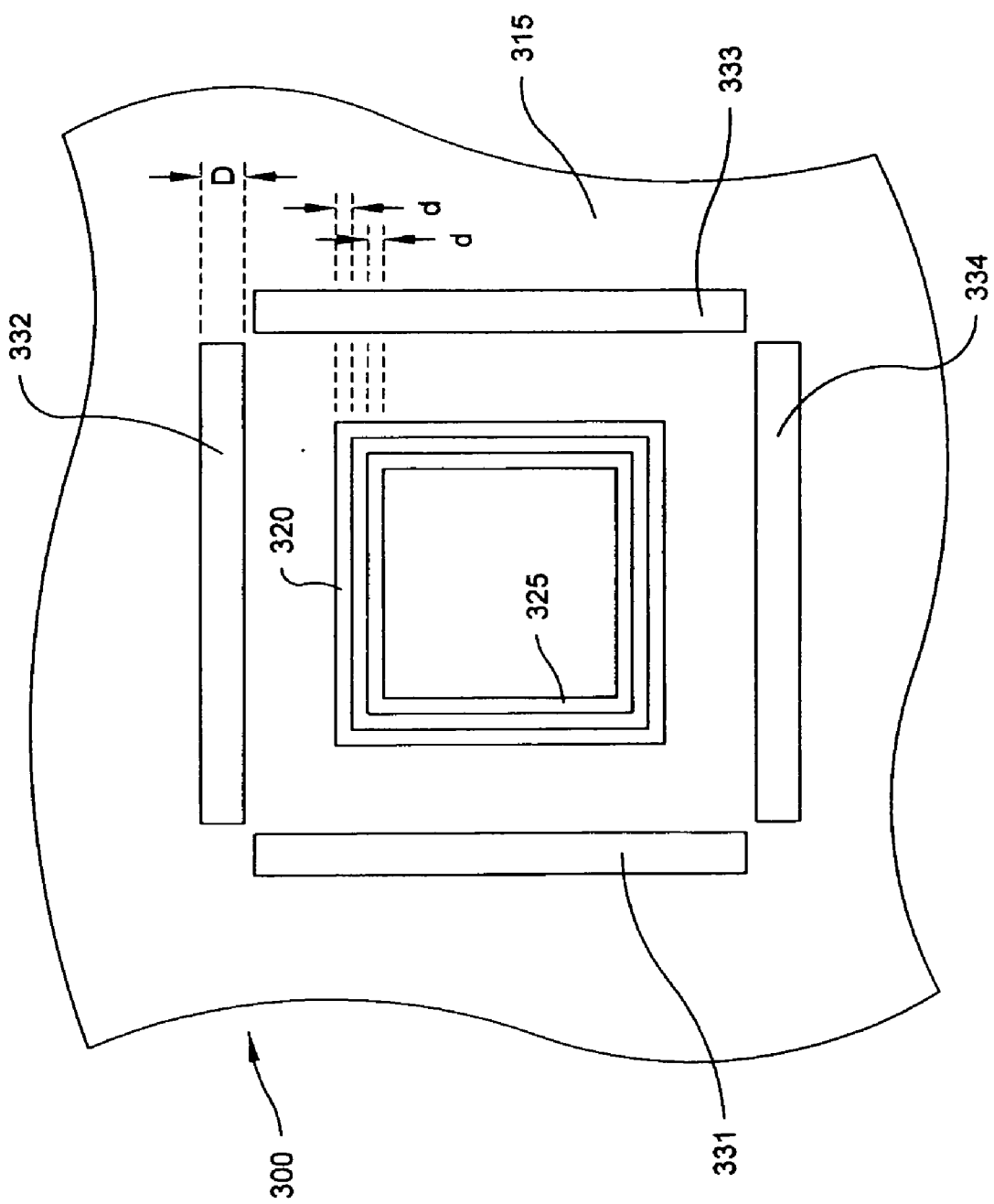
FIG. 3 is a top view schematic representation of a pattern registration mark in accordance with another embodiment of the present invention.
Figure 4:
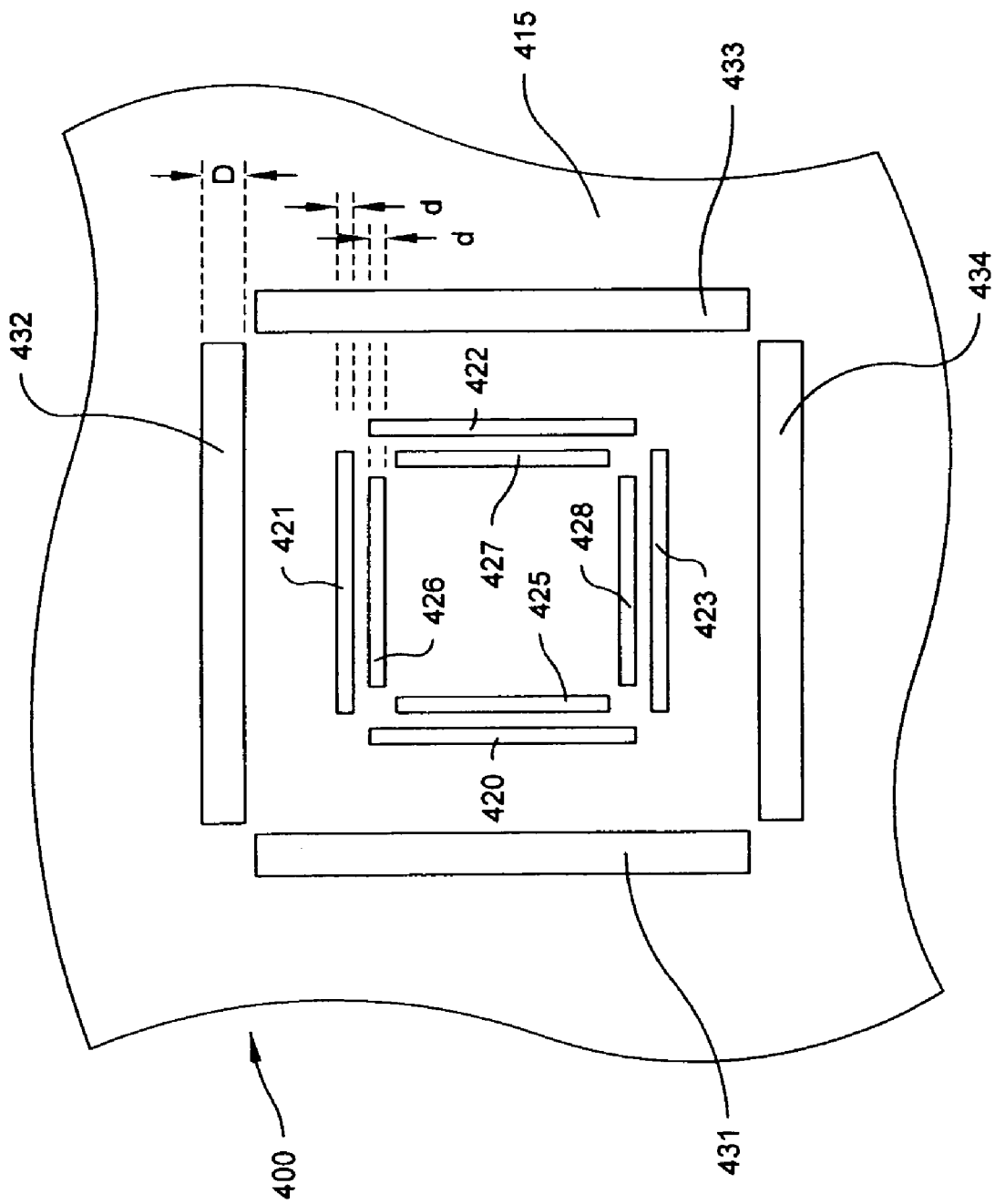
FIG. 4 is a top view schematic representation of a pattern registration mark in accordance with another embodiment of the present invention.

In various embodiments according to the present invention, either or both of the inner trench and the outer trench may comprise two or more separate trenches spaced apart from one another. Each of the two or more separate trenches can be discontinuous or continuous. For example, referring to FIG. 3, pattern registration mark 300 formed in an upper material layer 315 disposed above a substrate includes an inner trench which comprises separate trenches 320 and 325 spaced apart from one another. Pattern registration mark 300 also includes a discontinuous outer trench comprised of four linear segments 331, 332, 333 and 334. Alternatively, for example, referring to FIG. 4, pattern registration mark 400 formed in an upper material layer 415 disposed above a substrate includes an inner trench which comprises separate discontinuous trenches comprised of four linear segments each. Thus, one of the separate trenches which serves as part of the inner trench comprises segments 420, 421, 422 and 423, and another separate trench of the inner trench comprises segments 425, 426, 427 and 428. The two sets of four segments being spaced apart from one another. Pattern registration mark 400 also includes a discontinuous outer trench comprised of four linear segments 431, 432, 433 and 434. In general, the two or more separate trenches are spaced apart from one another at a distance smaller than the separation between the inner trench and the outer trench. Preferably, the two or more separate trenches are spaced apart from one another in a substantially equidistant fashion along the entire length of the two or more trenches.

Figure 5:
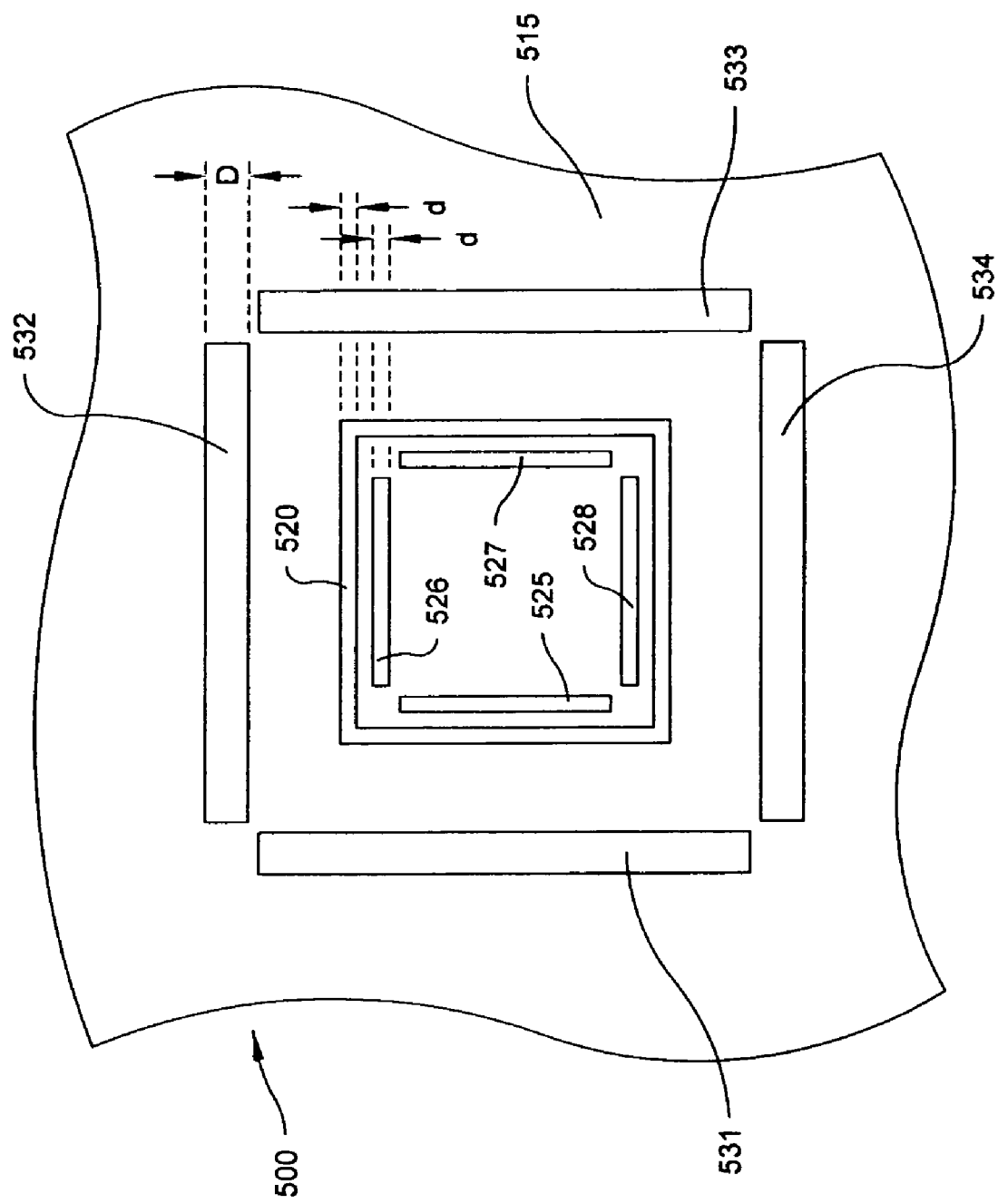
FIG. 5 is a top view schematic representation of a pattern registration mark in accordance with another embodiment of the present invention.
Figure 6:
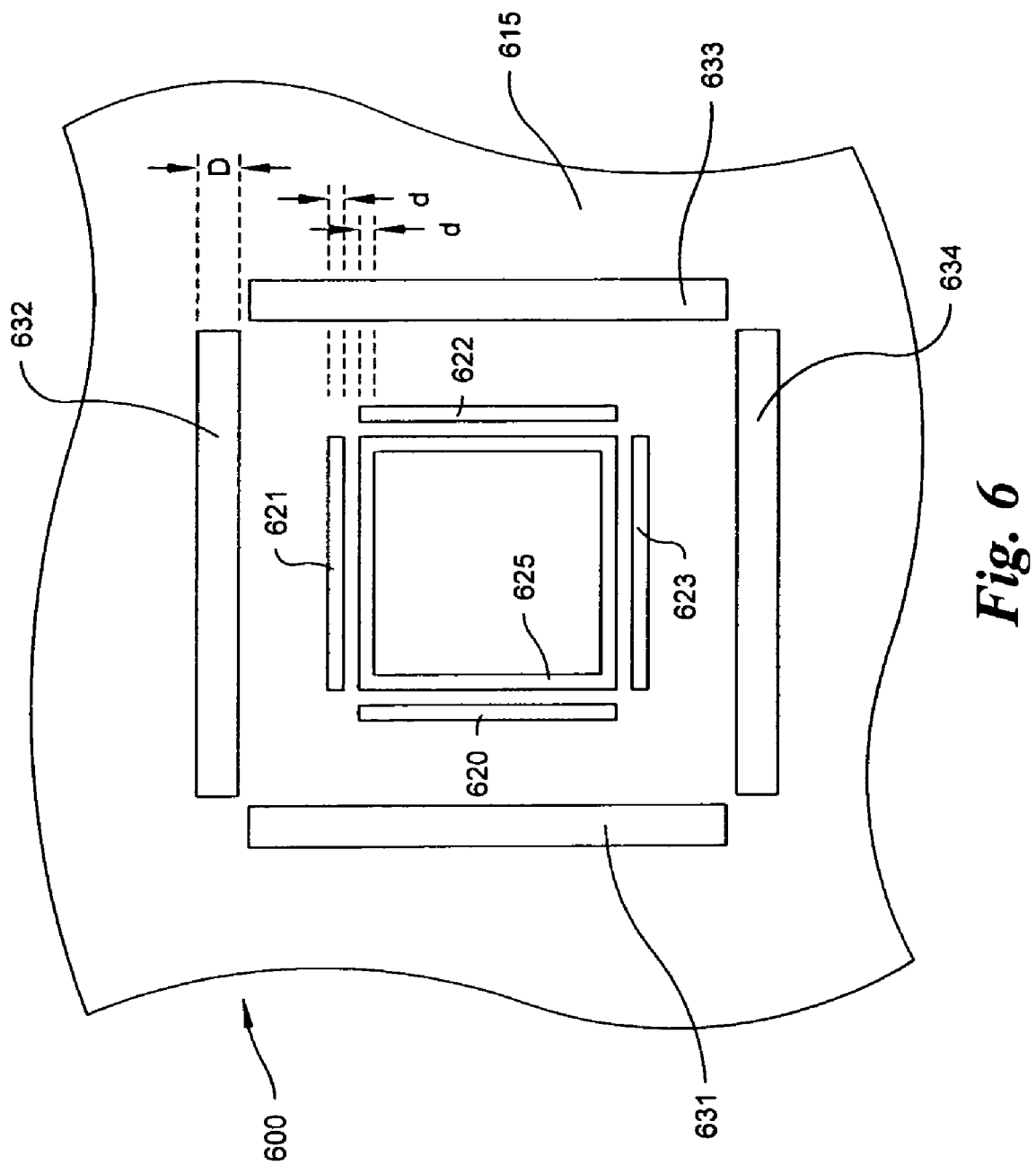
FIG. 6 is a top view schematic representation of a pattern registration mark in accordance with another embodiment of the present invention.

In certain embodiments according to the present invention, one or both of the inner trench and the outer trench can include two or more separate trenches spaced apart from one another where one of the two separate trenches comprises four discontinuous linear segments arranged in a quadrilateral formation and another of the same two separate trenches comprises a continuous quadrilateral formation. Referring to FIG. 5, for example, pattern registration mark 500 formed in an upper material layer 515 disposed above a substrate includes an inner trench which comprises two separate trenches spaced apart from one another. One of the two separate trenches 520 comprises a continuous quadrilateral formation. Another of the separate trenches comprises four discontinuous segments 525, 526, 527 and 528 arranged in a quadrilateral formation. Pattern registration mark 500 also includes a discontinuous outer trench comprised of four linear segments 531, 532, 533 and 534. Alternatively, referring to FIG. 6, for example, pattern registration mark 600 formed in an upper material layer 615 disposed above a substrate includes an inner trench which comprises two separate trenches spaced apart from one another. One of the two separate trenches 625 comprises a continuous quadrilateral formation. Another of the separate trenches comprises four discontinuous segments 620, 621, 622 and 623 arranged in a quadrilateral formation. Pattern registration mark 600 also includes a discontinuous outer trench comprised of four linear segments 631, 632, 633 and 634. In other words, in embodiments of the present invention where the outer trench and/or the inner trench each comprise multiple trenches, the multiple trenches can mix both discontinuous formations and continuous shapes.

Figure 7:
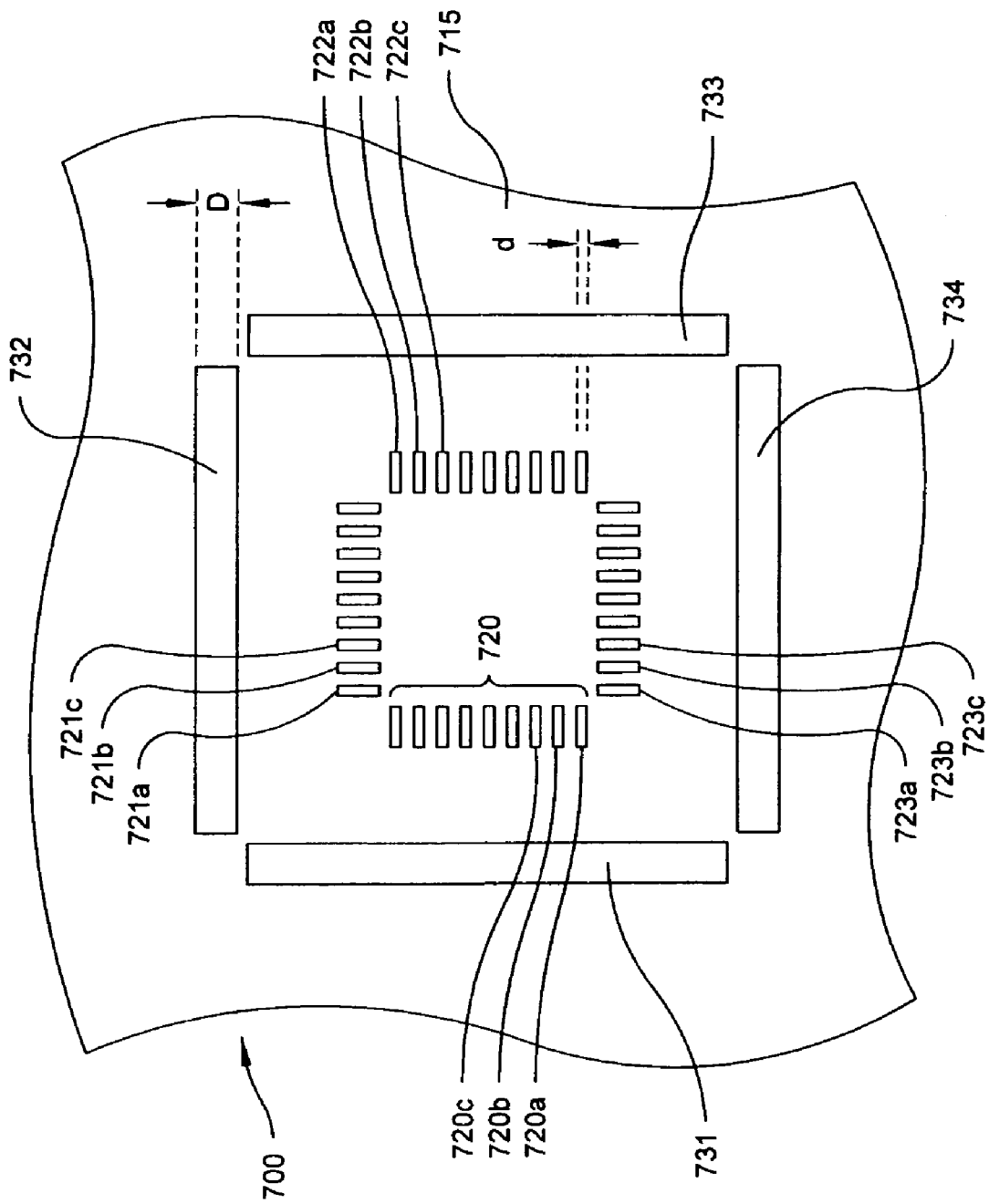
FIG. 7 is a top view schematic representation of a pattern registration mark in accordance with another embodiment of the present invention.

In certain embodiments of the present invention, one or both of the inner and outer trenches can comprise a plurality of parallel linear segments. Referring to FIG. 7, for example, pattern registration mark 700 formed in an upper material layer 715 disposed above a substrate comprises a discontinuous quadrilateral outer trench comprised of four linear segments 731, 732, 733 and 734. Additionally, pattern registration mark 700 includes an inner trench comprised of a plurality of parallel linear segments. The parallel linear segments are arranged in four separate groups which together are arranged in a quadrilateral formation. One group of linear segments 720 provides one "side" of the quadrilateral formation. Each group consists of a plurality of parallel linear segments. thus, group 720 comprises segments 720a, 720b, 720c, etc. Another group includes 721a, 721b, 721c, etc. Another group includes 722a, 722b, 722c, etc. A fourth group includes 723a, 723b, 723c, etc. In general, the two or more, and preferably several, segments in such embodiments are arranged in a parallel format such that each is aligned in the same direction as the others. Preferably, the plurality of parallel linear segments in such embodiments are disposed perpendicular to the length direction of the other trench. For example, where the inner trench comprises a plurality of parallel linear segments, the segments are aligned in parallel succession to one another with each segment perpendicular to the length direction of the outer trench side or segment with which the plurality of segments corresponds.

The present invention also relates to methods of using pattern registration marks according to any one of the various embodiments of the invention described above for aligning successive patterns in a lithographic process. In general, the methods of the present invention provide for the improved positional adjustment of a successive pattern in relation to a preceding pattern in a multi-layer structure, on the basis of a registration error measurement which can be obtained through the use of a registration mark in accordance with the present invention.

The methods of the present invention include forming a pattern registration mark in an upper material layer disposed above a substrate. Suitable substrates and upper material layers are described above. A pattern registration mark refers to a mark as described above in any of the various embodiments of the marks according to the present invention. Accordingly, a pattern registration mark formed in an upper material layer disposed above a substrate comprises an outer trench formed in the upper material layer, the outer trench having an outer trench width; an inner trench formed in the upper material layer, the inner trench having an inner trench width; and a conformal layer disposed on the upper material layer and in the inner trench and the outer trench, the conformal layer having a conformal layer thickness; wherein the outer trench width is greater than twice the conformal layer thickness, and wherein the inner trench width is less than or equal to twice the conformal layer thickness.

Referring to FIGS. 8a-8b, for example, a method in accordance with one embodiment of the present invention is schematically depicted at various stages. In FIG. 8a, as shown in cross-section, inner trench 820 and outer trench segments 832 and 834 are formed (e.g., via etching) in the upper material layer 815 above substrate 810. In FIG. 8b, a conformal layer 840 is formed over the upper material layer and on the surfaces of the inner trench and the outer trench. The inner trench is sized such that the conformal layer completely fills the inner trench. In FIG. 8c, a portion of the conformal layer has been removed so that only the portions of the conformal layer within the inner trench and within the outer trench remain. Any shift in the conformal material in the outer trench that may have resulted from the removal of the portion of the conformal layer is measured versus the stationary position of the inner trench. In FIG. 8d, a subsequent layer 850 is deposited on the upper material layer and a subsequent pattern 860 is aligned versus the outer trench with compensation for the measured shift. The subsequent layer 850 can then be patterned with precision using the pattern 860.

Formation of the pattern registration mark in accordance with methods of the present invention generally includes removal of upper material layer material and formation of a conformal layer on the upper material layer of the substrate and on the surfaces of the inner trench and the outer trench.

Removal of the upper material layer material can comprise any etching technique, known or to be developed, and may comprise either wet or dry etching. Etching to remove upper material layer material for the formation of a trench can include the deposition of a patterning layer and subsequent wet-etching with any suitable etching liquid which can vary depending on the material comprising the upper material layer of the substrate. Suitable patterning layers can comprise photoresist materials which can be applied and developed via standard techniques. Patterning layers may also include hard-masking materials, such as, for example, silicon nitride which can be deposited via any suitable method including, but not limited to, chemical vapor deposition and nitridation, and subsequently patterned by etching methods which are selective to nitride materials. Dry etching techniques can be preferable as their profile control is often better. Etch recipes which exhibit a high degree of selectivity between the upper material layer material and the substrate are also preferable.

The removal of the upper material layer material can include the formation or deposition of additional layers prior to, during or after patterning or etching and may include, for example, one or more photoresist layers, anti-reflective coatings, barrier layers, hard-masking layers and protective oxides.

The methods of the present invention further include the formation of a conformal layer on the upper material layer and on the surfaces of inner trench and the outer trench. The conformal layer may be comprised of any material and may be deposited in any manner, so long as the material is conformal to the underlying surfaces. The conformal layer preferably comprises a metal, and more preferably, comprises tungsten. A conformal layer comprising tungsten is preferably deposited via a chemical vapor deposition techniques.

Methods in accordance with the present invention further include removing a portion of the conformal layer such that remaining conformal layer material is disposed within the inner trench and within the outer trench. Preferably, the entire portion of the conformal layer which is outside of the inner trench and the outer trench is removed. Removal of the conformal coating can preferably be carried out via chemical-mechanical polishing (CMP) techniques.

Methods according to the present invention further include measuring a registration error between the outer trench and the inner trench of the pattern registration mark after a portion of the conformal layer is removed. Removal of the conformal layer can cause a shift in the center-position of the conformal layer material which is present in the outer trench. However, the inner trench is sized such that it is entirely filled with the conformal layer material and thus, shifting of the conformal material filling the inner trench is prevented. The "center-position" refers to the midpoint of the trench floor of the conformal material disposed in the trench. In other words, if viewing a cross-section of the trench perpendicular to the length dimension of the trench, the "center-position" refers to the point along the bottom of the trench which is equidistant from the sidewalls of the trench.

When the conformal layer is removed, material and residue from planarization processes can be deposited in the trench in a manner such that one side wall is made larger than the other, and thus the center-position is shifted. In CMP planarization processes, there is rotational abrasive force which can result in additional shift in a direction parallel to the trench length and also in an apparent rotation of the entire length axis of the trench. The center-position of the trench, which in practice is often the deepest point along a cross-section of the trench, which after planarization may no longer have an essentially flat bottom between the two sidewalls, can be measured via optical equipment through a regression analysis model.

A registration error can include both a translational shift component in the x and the y direction, as well as a rotational component which may result from CMP processes. Thus, registration error refers to one or more of: displacement of the center-position of the conformal layer material in the outer trench in a direction perpendicular to the length direction of the trench (i.e., $T_x$); displacement of the center-position of the conformal layer material in the outer trench in a direction parallel to the length direction of the trench (i.e., $T_y$); and rotational movement of the trench fill material relative to the original length direction axis of the trench (i.e., Rot).

Each component of the registration error can be measured versus the original location of the center-position of the conformal layer material in the outer trench prior to any shift resulting from planarization or other processing. For example, measuring a registration error can comprise quantifying one or more or all of: the translational movement of the center-position in the x direction; the translational movement of the center-position in the y direction; and the rotational shift of the trench center-position.

Methods according to the present invention further include adjusting subsequent pattern placement relative to the outer trench based on the measured registration error. Adjusting subsequent pattern placement can include offsetting the position of a subsequent pattern relative to the observed location of the outer trench in amounts and directions equal to the measured registration error. For example, in a pilot run, the positional placement of the registration mark in the upper material layer of the substrate can be set in a scanner/stepper apparatus at zero, and subsequent to planarization, the registration error can be measured via an optical overlay tool. The registration error can then be entered into the scanner/stepper apparatus to compensate for the shift in the outer trench prior to reworking the wafer.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

What is claimed is:

1. A pattern registration mark comprising:
   a substrate and an upper material layer disposed above the substrate;
   an outer trench formed in the upper material layer, the outer trench having an outer trench width;
   an inner trench formed in the upper material layer, the inner trench having an inner trench width; and
   a conformal layer disposed in the inner trench and the outer trench, the conformal layer having a conformal layer thickness;
   wherein the outer trench width is greater than twice the conformal layer thickness, and wherein the inner trench width is less than or equal to twice the conformal layer thickness.

2. The pattern registration mark according to claim 1, wherein the conformal layer comprises a metal.

3. The pattern registration mark according to claim 1, wherein the conformal layer comprises tungsten.

4. The pattern registration mark according to claim 1, wherein the upper material layer comprises an oxide.

5. The pattern registration mark according to claim 1, wherein the outer trench comprises four discontinuous linear segments arranged in a quadrilateral formation.

6. The pattern registration mark according to claim 1, wherein the outer trench comprises a continuous quadrilateral formation.

7. The pattern registration mark according to claim 1, wherein the inner trench comprises four discontinuous linear segments arranged in a quadrilateral formation.

8. The pattern registration mark according to claim 1, wherein the inner trench comprises a continuous quadrilateral formation.

9. The pattern registration mark according to claim 1, wherein the outer trench comprises two or more separate trenches spaced apart from one another.

10. The pattern registration mark according to claim 1, wherein the inner trench comprises two or more separate trenches spaced apart from one another.

11. The pattern registration mark according to claim 1, wherein one or both of the inner trench and the outer trench comprises two or more separate trenches spaced apart from one another, and wherein at least one of the two or more separate trenches comprises four discontinuous linear segments arranged in a quadrilateral formation and another of the same two or more separate trenches comprises a continuous quadrilateral formation.

12. The pattern registration mark according to claim 1, wherein the inner trench comprises a plurality of parallel linear segments.

13. The pattern registration mark according to claim 1, wherein the outer trench comprises a plurality of parallel linear segments.

14. The pattern registration mark according to claim 1, further comprising an additional layer disposed above the conformal layer, wherein the width of the outer trench is greater than twice the combined thickness of the conformal layer and the additional layer.

15. The pattern registration mark according to claim 5, wherein the four discontinuous linear segments are equal in length.

16. The pattern registration mark according to claim 6, wherein the continuous quadrilateral formation is a square.

17. The pattern registration mark according to claim 7, wherein the four discontinuous linear segments are equal in length.

18. The pattern registration mark according to claim 8, wherein the continuous quadrilateral formation is a square.

19. The pattern registration mark according to claim 12, wherein the parallel linear segments are disposed in a direction perpendicular to a linear portion of the outer trench.

20. The pattern registration mark according to claim 13, wherein the parallel linear segments are disposed in a direction perpendicular to a linear portion of the inner trench.

21. A method comprising:

forming a pattern registration mark in an upper material layer disposed above a substrate, wherein the mark comprises an outer trench formed in the upper material layer, the outer trench having an outer trench width; an inner trench formed in the upper material layer, the inner trench having an inner trench width; and a conformal layer disposed on the upper material layer and in the inner trench and the outer trench, the conformal layer having a conformal layer thickness;

wherein the outer trench width is greater than twice the conformal layer thickness, and wherein the inner trench width is less than or equal to twice the conformal layer thickness;

removing a portion of the conformal layer such that the remaining conformal layer is disposed in the inner trench and in the outer trench;

measuring a registration error between the outer trench and the inner trench of the pattern registration mark; and adjusting subsequent pattern placement relative to the outer trench based on the measured registration error.

22. The method according to claim 21, wherein removing the portion of the conformal layer comprises chemical mechanical polishing.

* * * * *